(12) United States Patent
Kim

(10) Patent No.: US 7,282,405 B2
(45) Date of Patent: Oct. 16, 2007

(54) SEMICONDUCTOR MEMORY DEVICE AND METHOD FOR MANUFACTURING THE SAME

(75) Inventor: Ji-Young Kim, Kyungki-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 355 days.

(21) Appl. No.: 11/108,929

(22) Filed: Apr. 18, 2005

(65) Prior Publication Data

US 2005/0186728 A1 Aug. 25, 2005

Related U.S. Application Data

(62) Division of application No. 10/426,153, filed on Apr. 29, 2003, now Pat. No. 6,903,404.

(30) Foreign Application Priority Data

May 17, 2002 (KR) ................ 2002-27441

(51) Int. Cl.
*H01L 21/8242* (2006.01)
(52) U.S. Cl. ................ 438/241; 257/E21.648
(58) Field of Classification Search ................ 438/241, 438/248, 391; 257/E21.648
See application file for complete search history.

(56) References Cited

U.S. PATENT DOCUMENTS 5,392,232 A * 2/1995 Kim et al. ................ 365/51
6,228,700 B1 5/2001 Lee
6,329,241 B1 * 12/2001 Lin ................ 438/253
6,570,205 B2 * 5/2003 Shin et al. ................ 257/296
2003/0109104 A1 6/2003 Chen et al.

FOREIGN PATENT DOCUMENTS

| JP | 11-166452 | 6/1999 |
|---|---|---|
| KR | 2000-44673 | 7/2000 |
| KR | 2001-56239 | 7/2001 |

OTHER PUBLICATIONS

English language abstract of Korean Publication No. 2000-44673.
English language abstract of Korean Publication No. 2001-56239.

* cited by examiner

*Primary Examiner*—Chandra Chaudhari
(74) *Attorney, Agent, or Firm*—Marger Johnson & McCollom, P.C.

(57) ABSTRACT

A semiconductor memory device includes a plurality of bit line structures arranged in parallel on a semiconductor substrate and having a plurality of bit lines and an insulating material surrounding the bit lines, an isolation layer formed in a portion in spaces between the bit line structures to define a predetermined active region and having substantially the same height as the bit line structures, a semiconductor layer formed in the predetermined active region surrounded by the bit line structures and the isolation layer and having substantially the same height as the bit line structures and the isolation layer, a plurality of word line structures arranged in parallel on the bit line structures, the isolation layer, and the semiconductor layer, and comprising a plurality of word lines and an insulating material surrounding the word lines, and source and drain regions formed in the semiconductor layer on either side of the word line structures.

16 Claims, 6 Drawing Sheets

SEMICONDUCTOR MEMORY DEVICE AND METHOD FOR MANUFACTURING THE SAME

This application is a Divisional of U.S. Pat. No. 10/426,153, filed on Apr. 29, 2003, now U.S. Pat. No. 6,903,404, which claims priority from Korean Application No. 2002-27441, filed May 17, 2002, which are hereby incorporated by reference in their entirety.

BACKGROUND OF THE INVENTION

1. Field of the Invention

The present invention relates to semiconductor memory devices and, more particularly, to semiconductor memory devices having bit lines and a method for manufacturing the same.

2. Description of the Related Art

The driving capability of a dynamic random access memory (DRAM) is determined by the capacitance of capacitors. However, as semiconductor devices become highly integrated, the area allocated for forming capacitors within the devices typically becomes reduced and therefore it may be difficult to obtain required capacitance levels. This is because the capacitance of capacitors is directly proportional to the surface area of the capacitor electrodes. Therefore, many efforts have been made to increase the capacitance by increasing the effective surface area.

Along this trend, fabrication technologies have been developed to increase the height of a storage node electrode, to increase the effective surface area thereof. For example, a storage node electrode is formed in a concave or cylindrical shape having a height of more than 1 µm.

However, technology for securing capacitance by increasing the height of a capacitor has its own limit. For example, if the height of the capacitor is increased, it typically leads to an increase in an aspect ratio of the capacitors. Furthermore, it can destroy a capacitor electrode or cause a bridge between adjacent capacitors.

Also, a capacitor over a bit line (COB) structure has been introduced to replace a capacitor under a bit line (CUB) structure to secure a larger capacitor area. More specifically, the CUB has a structure in which a capacitor is formed first, and then bit lines are formed on the capacitor. In the CUB structure, since the bit lines are formed on a capacitor with a relatively large height, short circuits can occur. Accordingly, there is a limit in increasing the height of the capacitors. For this reason, currently available DRAMs have adopted the COB structure having capacitors on the bit lines, which are in turn formed on word lines.

The capacitor in the COB structure includes storage node contact pads, positioned between the bit lines, for connecting a MOS transistor source (or a contact pad connected to the source) to the storage node electrode. If integration of the semiconductor device increases, the distance between the bit lines and the storage node contact pads reduces. This leads to problems where insulation between the bit lines and the storage contact pad is not secured, and any pattern misalignment could cause short circuits between the bit lines and the storage node contact pads.

SUMMARY OF THE INVENTION

According to one embodiment of the present invention, a semiconductor memory device comprises a semiconductor substrate and a plurality of bit line structures arranged in parallel on the semiconductor substrate. The bit line structures comprise a plurality of bit lines and an insulating material surrounding the bit lines. The semiconductor device further includes an isolation layer formed in a predetermined portion in spaces between the bit line structures to define a predetermined active region. The isolation layer has substantially the same height as the bit line structures. A semiconductor layer such as a silicon layer is formed in the predetermined active region surrounded by the bit line structures and the isolation layer. The semiconductor layer has substantially the same height as the bit line structures and the isolation layer. A plurality of word line structures are arranged in parallel on top of the bit line structures, the isolation layer, and the silicon layer. The word line structures comprise a plurality of word lines and an insulating material surrounding the word lines. Source and drain regions are formed on the silicon layer on either side of the word line structures.

According to another embodiment of the present invention, a semiconductor memory device comprises a semiconductor substrate and a plurality of bit line structures arranged in parallel on the semiconductor substrate. The bit line structures comprise a plurality of bit lines and an insulating material surrounding the bit lines. An isolation layer is formed in a predetermined portion in spaces between the bit lines to define a predetermined active region. A single crystal epitaxial silicon layer is formed in the predetermined active region surrounded by the bit line structures and the isolation layer. The single crystal epitaxial silicon layer has substantially the same height as the bit line structures and the isolation layer. A plurality of word line structures are arranged in parallel on top of the bit line structures, the isolation layer, and the silicon layer, and comprising a plurality of word lines and an insulating material surrounding the word lines. Source and drain regions are formed on the single crystal epitaxial silicon layer on either side of the word line structures. A first interlayer insulating layer is formed overlying the word line structures. The first interlayer insulating layer includes a first contact pad contacting the source region and a second contact pad contacting the drain region and the bit lines. A second interlayer insulating layer is formed on top of the first interlayer insulating layer. The second interlayer insulating layer includes a storage node contact pad connected to the first contact pad. A storage node capacitor is formed on top of the second interlayer insulating layer and contacting the storage node contact pad.

According to yet another embodiment of the present invention, there is provided a method for manufacturing a semiconductor memory device, the method comprising: forming a plurality of bit line structures arranged in parallel on a semiconductor substrate; forming an isolation layer in a predetermined portion between the bit line structures to define a predetermined active region; forming a semiconductor layer such as a silicon layer formed in the predetermined active region surrounded by the bit line structures and the isolation layer; forming a plurality of word line structures arranged in parallel on top of the bit line structures, the isolation layer, and the silicon layer; and forming source and drain regions on the silicon layer on either side of the word line structures.

According to still another embodiment of the present invention, there is provided a method for manufacturing a semiconductor memory device, the method comprising: forming a plurality of bit line structures comprising a plurality of bit lines and arranged in parallel on a semiconductor substrate; forming an isolation layer in a predetermined portion between the bit line structures to define a predetermined active region; epitaxially growing a semiconductor material such as silicon on the predetermined active region in the semiconductor substrate, which is surrounded by the bit line structures and the isolation layer, to the height of the bit line structures and the isolation layer; forming a plurality of word line structures comprising a plurality of word lines and arranged in parallel on top of the bit line structures, the isolation layer, and the silicon layer; forming source and drain regions on the silicon layer on either side of the word line structures; forming a first interlayer insulating layer overlying the word line structures; forming a first contact pad contacting the source region and a second contact pad contacting the drain region and the bit lines, within the first interlayer insulating layer; forming a second interlayer insulating layer on top of the first interlayer insulating layer; forming a storage node contact pad connected to the first contact pad; and forming a storage node capacitor on top of the second interlayer insulating layer and contacting the storage node contact pad.

BRIEF DESCRIPTION OF THE DRAWINGS

The above objects and advantages of the present invention will become more apparent by describing in detail exemplary embodiments thereof with reference to the attached drawings, in which.

DETAILED DESCRIPTION OF THE INVENTION

Figure 1:
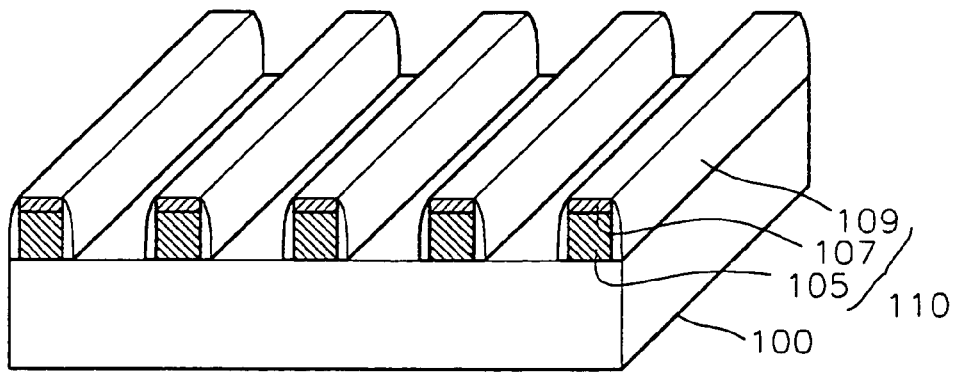
FIGS. 1 through 6 are perspective views for describing the process of manufacturing a semiconductor memory device according to an embodiment of the present invention.

The present invention will now be described more fully with reference to the accompanying drawings, in which preferred embodiments of the invention are shown. This invention may, however, be embodied in many different forms, and should not be construed as being limited to the embodiments set forth herein. Rather, these embodiments are provided so that this disclosure will be thorough and complete and will fully convey the concept of the present invention to those skilled in the art. In the drawings, the thickness of layers and regions may be exaggerated for clarity. Like reference numerals in different drawings refer to like elements, and their description will not be repeated for simplicity. It will also be understood that when a layer is referred to as being "on" another layer or a substrate, it can be directly on the other layer or the substrate, or intervening layers may also be present.

Figure 7:
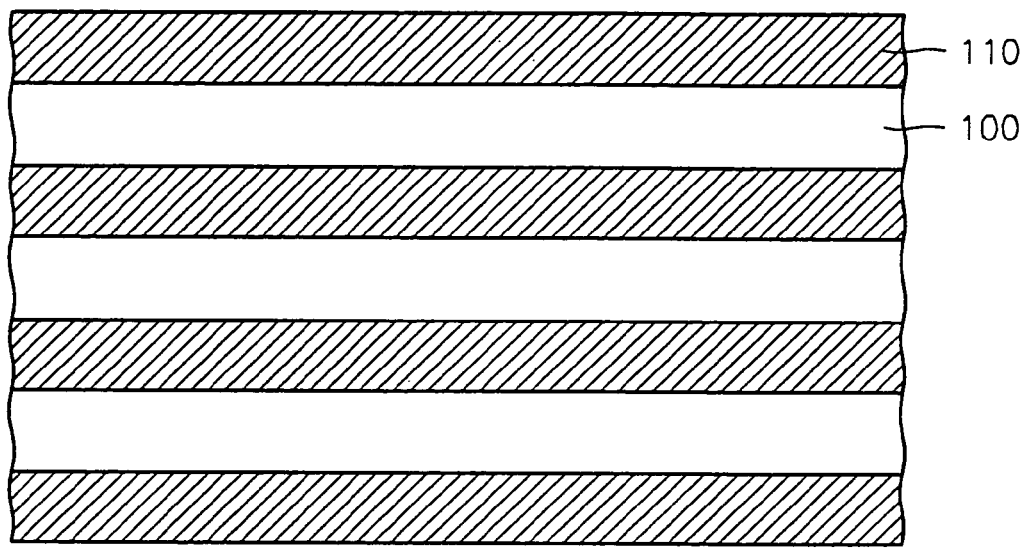
FIGS. 7 through 12 are plan views corresponding to FIGS. 1 through 6.

Referring to FIGS. 1 and 7, a semiconductor substrate 100 of a semiconductor memory device including a cell region and peripheral circuit region is shown. The semiconductor substrate 100 may be a silicon substrate. However, other suitable semiconductor substrate can be used. In the drawings, however, only the cell region of the semiconductor substrate 100 is shown.

A conductive layer for forming bit lines (hereinafter, bit line conductive layer) 105 and a protective insulating layer 107 are formed on the semiconductor substrate 100. Before forming the bit line conductive layer 105, an additional buffer insulating layer (not shown) may also be formed. The bit line conductive layer 105 can be, for example, a tungsten metal, metal silicide, or doped polycrystalline silicon layer.

Here, it is preferable that the bit line conductive layer 105 be deposited to a thickness of, for example, more than about 0.25 μm, the thickness of an isolation layer (not shown) to be formed.

It is also preferable that the protective insulating layer 107 be formed of a material that can be selectively etched with respect to a silicon oxide layer to be used as an interlayer insulating layer. For example, the protective insulating layer 107 may be a silicon nitride layer. The protective insulating layer 107 and the bit line conductive layer 105 are patterned in the shape of bit lines. If the buffer insulating layer (not shown) is formed under the bit line conductive layer 105, not only the protective insulating layer 107 and the bit line conductive layer 105 but also the buffer insulating layer is etched. After the protective insulating layer 107 and the bit line conductive layer 105 are etched, an insulating layer for forming a spacer 109 is arranged on the semiconductor substrate 100. The spacer 109 is formed by anisotropically etching the insulating layer.

It is preferable that the spacer 109 be also formed of the same material as that of the protective insulating layer 107. Here, the bit line conductive layer 105, the protective insulating layer 107, and the spacer 109 are collectively referred to as bit line structures 110. A plurality of bit line structures 110 are arranged in parallel to one other at regular intervals.

Figure 2:
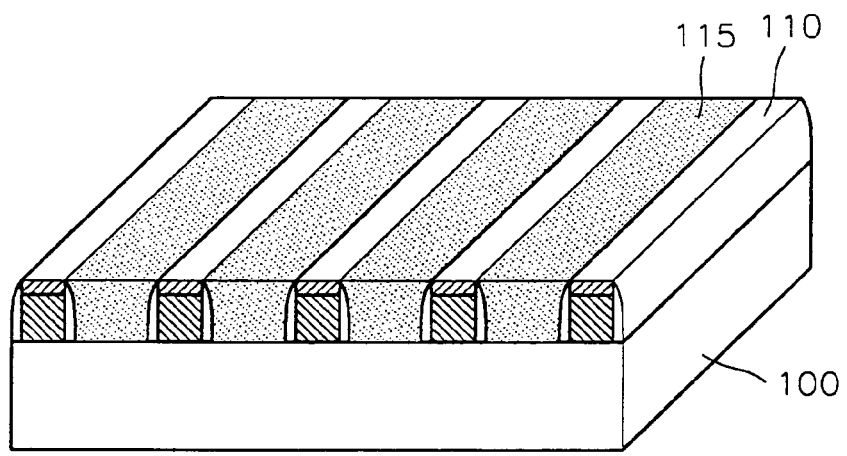
Figure 8:
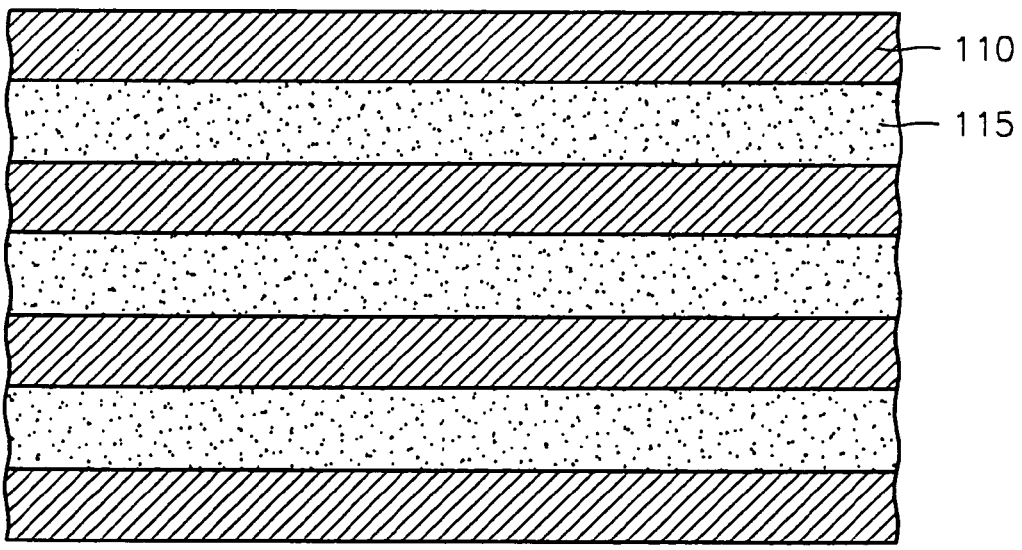

As shown in FIGS. 2 and 8, an insulating layer 115 is deposited to fill the space between the bit line structures 110. The insulating layer 115 may be a silicon oxide layer. Next, the insulating layer 115 is planarized by, for example, a chemical mechanical polishing (CMP) until the surface of the bit line structures 110 is exposed. Accordingly, the insulating layer 115 is filled in the space between the bit line structures 110.

Figure 3:
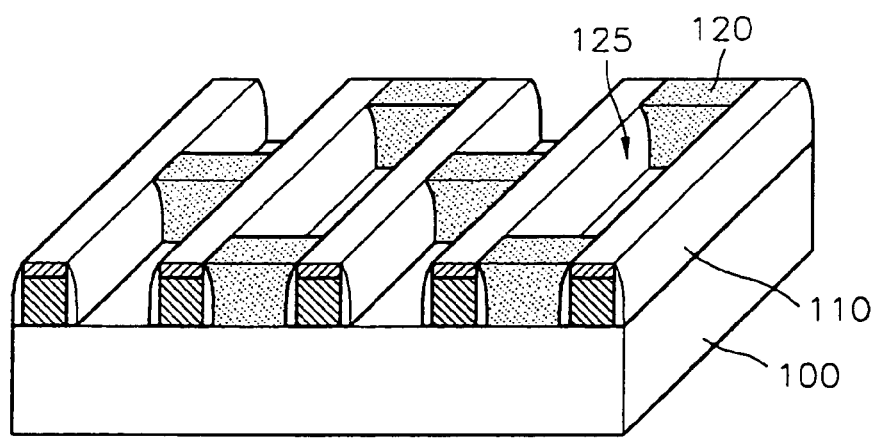
Figure 9:
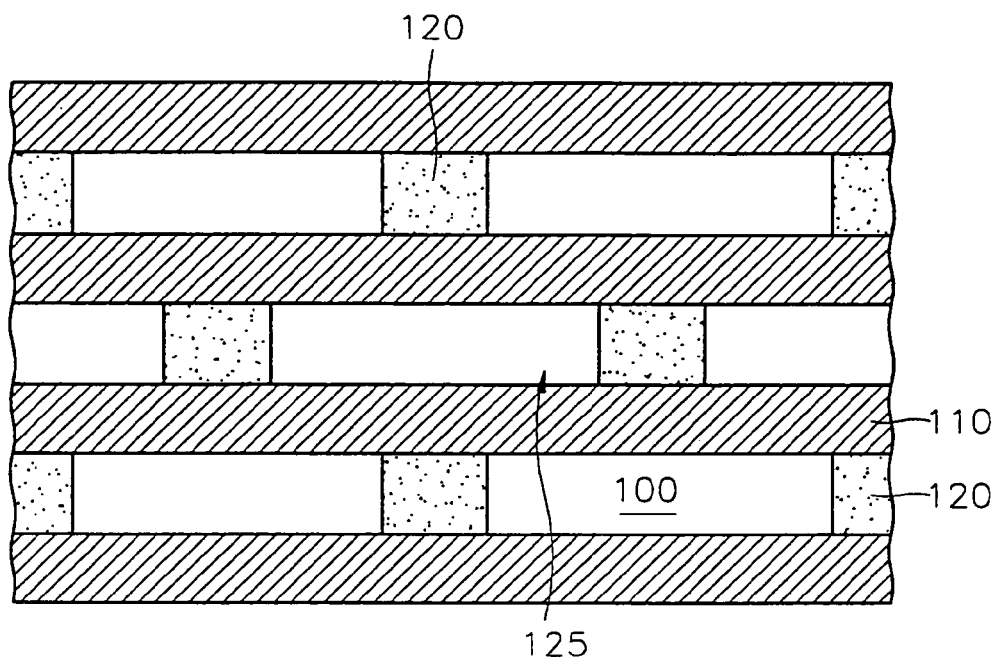

Next, isolation layers 120 are formed by etching a portion of the insulating layer 116 to define a predetermined active region 125, as shown in FIGS. 3 and 9. Accordingly, the space surrounded by the bit line structures 110 and the isolation layers 120 is secured and becomes the predetermined active region 125. Here, the isolation layers 120 are formed such that the predetermined active region 125 in each row is arranged to overlap with another predetermined active region 125 in another row, and has the same height as the bit line structures 110.

Figure 4:
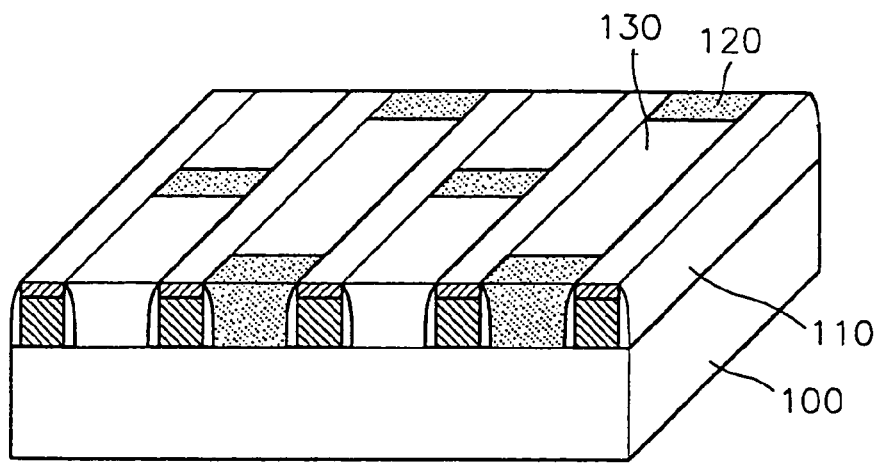
Figure 10:
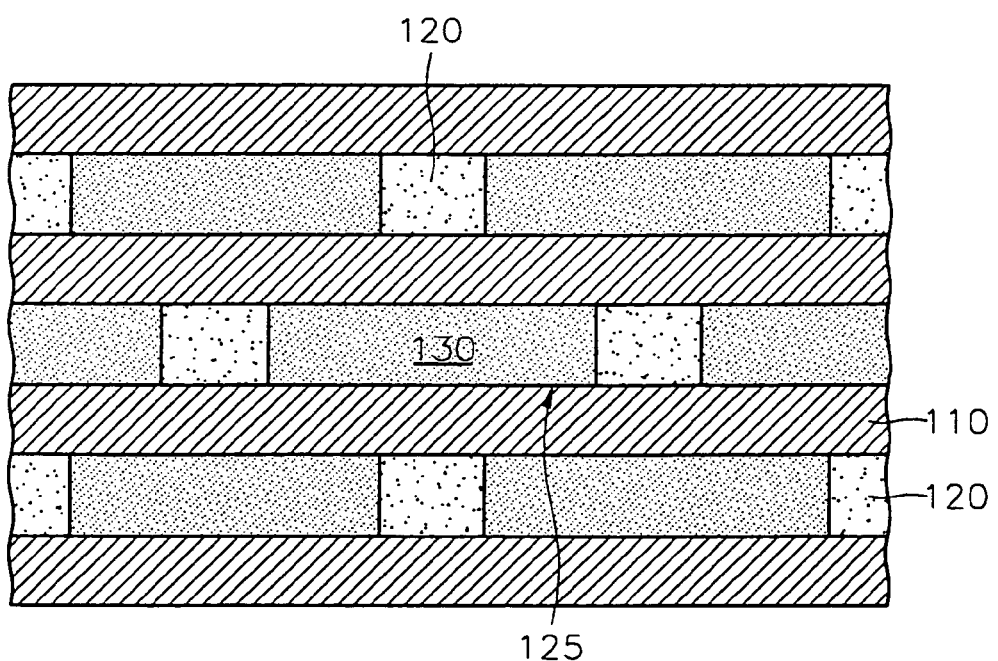

Referring to FIGS. 4 and 10, a semiconductor layer such as a silicon layer is preferably formed by selective epitaxial growth in the predetermined active region 125 of the semiconductor substrate 100 to form an active region 130. As described above, the rows of the active region 130 are formed to overlap with one another. In addition, the active region 130 is surrounded by the insulation layer 107 (FIG. 2), the spacer 109 (FIG. 2), and the isolation layer 120 and thus is electrically isolated from the bit line conductive layer 105. The active region 130 is obtained by growing the semiconductor substrate 100 to have substantially the same height as the bit line structures 110 (or the isolation layer 120).

In the embodiment described above, the bit line structures 110 are formed on the semiconductor substrate 100, and the epitaxial silicon layer (active region 130) is formed on both sides of the bit line structures 110. Thus, the bit line structures 110 can be buried in the semiconductor substrate 100 because the epitaxial layer is formed of the same material as that of the semiconductor substrate 100. Accordingly, it is possible to describe the bit line structures 110 having the above-described structure as being positioned in the substrate 100.

Figure 5:
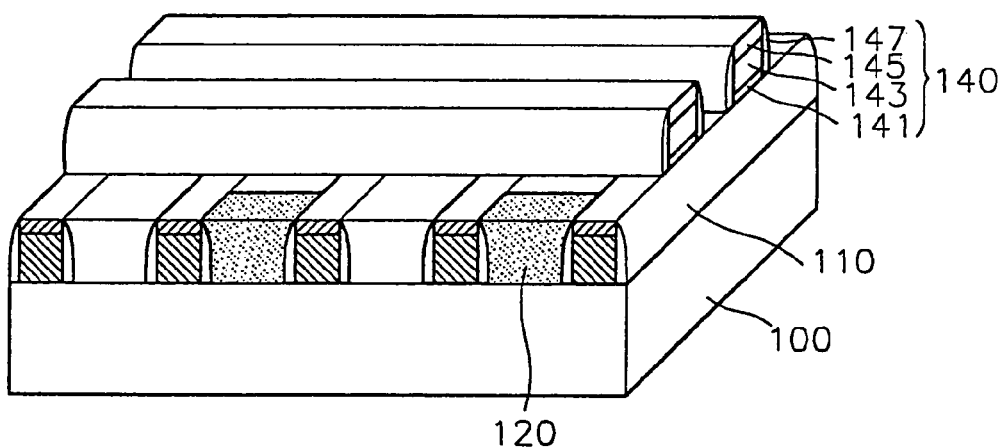
Figure 11:
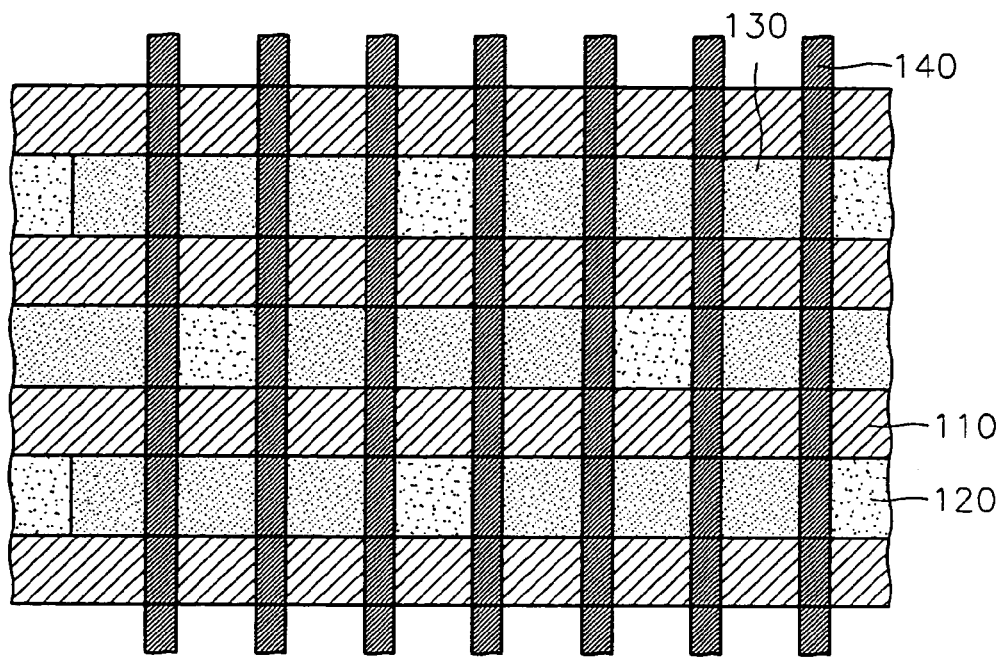

Next, as shown in FIGS. 5 and 11, word line structures 140 are formed on top of the resultant structure including the bit line structures 110, the isolation layer 120, and the active region 130. Rows of word line structures 140 are arranged at regular intervals to overlap with rows of bit line structures 110. For example, a couple of word line structures 140 are arranged in a single active region 130. Here, each of the word line structures 140 includes a gate insulating layer 141 formed on the surface of the resultant structure including the bit line structures 110, a word line 143 formed on top of the gate insulating layer 141, a hard mask layer 145 formed on top of the word line 143, and a word line spacer 147 formed on the sidewalls of the word line 143 and the gate insulating layer 141. In addition, even though the word line structures 140 contact the bit line structures 110, word lines 143 and bit lines (bit line conductive layer) 105 are insulated from each other by the protective insulating layer 107 (FIG. 2) on the surface of the bit line structures 110.

Figure 6:
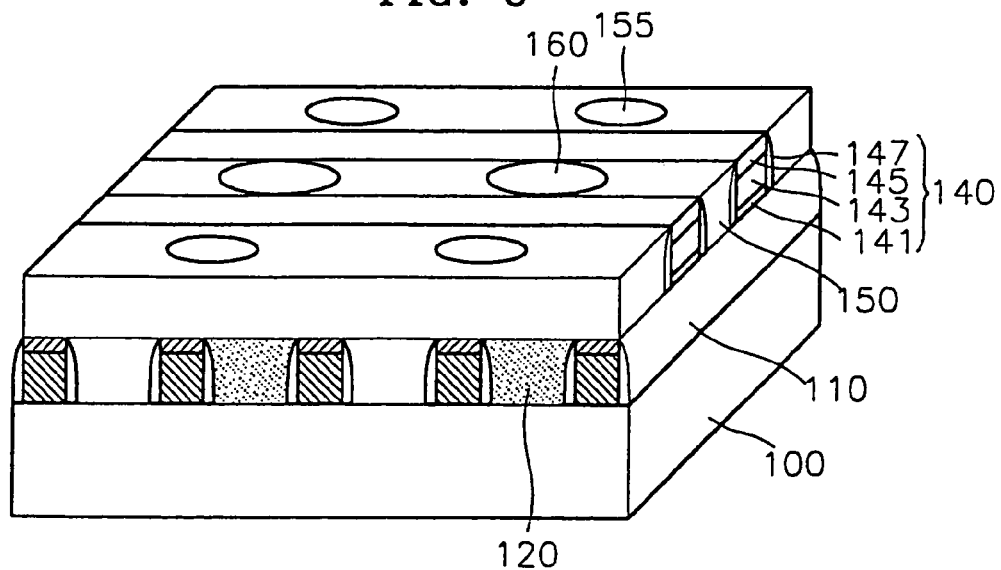
Figure 12:
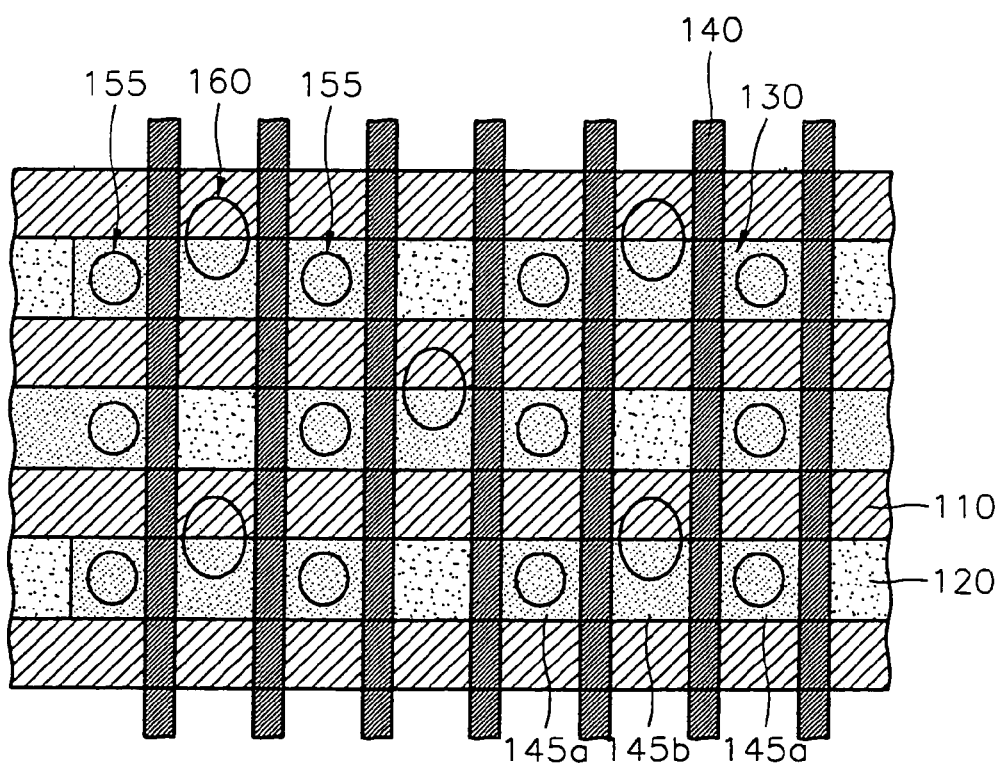

Referring to FIGS. 6 and 12, a source region 145a and a drain region 145b are defined by implanting dopants into the active region 130 on both sides of the word line structures 140. In detail, considering only an adjacent pair of word line structures 140, the source region 145a is formed in the active region 130 outside the pair of word line structures 140, and a drain region 145b is formed in the active region 130 between the word line structures 140. An interlayer insulating layer 150 is formed on the resultant structure. Next, the interlayer insulating layer 150 is planarized by, for example, CMP until the surface of the word line structures 140 is exposed and fills the spaces between the word line structures 140. Alternatively, the CMP process can be omitted.

Next, a storage node contact hole 155 and a bit line contact hole 160 are formed by patterning the interlayer insulating layer 150 to expose the source region 145a and the drain region 145b. Here, the storage node contact hole 155 exposes the source region 145a, and the bit line contact hole 160 exposes the bit line conductive layer 105 in the bit line structures 110 and the drain region 145b.

If the storage node contact hole 155 and the bit line contact hole 160 are formed by simultaneously etching the interlayer insulating layer 150 and the protective insulating layer 107, pattern misalignment may occur. To prevent this problem, the protective insulating layer 107 for protecting the bit line structures 110, in which the bit line contact hole 160 is formed, is partially removed before depositing the interlayer insulating layer 150 according to an embodiment of the present invention. Next, the interlayer insulating layer 150 is deposited on the resultant structure and partially etched so that the storage node contact hole 155 exposing the source region 145b and the bit line contact hole exposing the drain region 145b and the bit line conductive layer 150 are formed.

When forming the storage node contact hole 155 and the bit line contact hole 160, only the interlayer insulating layer 150 is etched. Therefore, there is no concern of causing a short circuit, even though the storage node contact hole 155 may partially extend into the region of the bit line structures 110 due to misalignment.

Next, the storage node contact pad (not shown) and the bit line contact pad (not shown) are formed by filling the storage node contact hole 155 and the bit line contact hole 160 with a conductive layer, thus completing a storage node capacitor (not shown).

Figure 13:
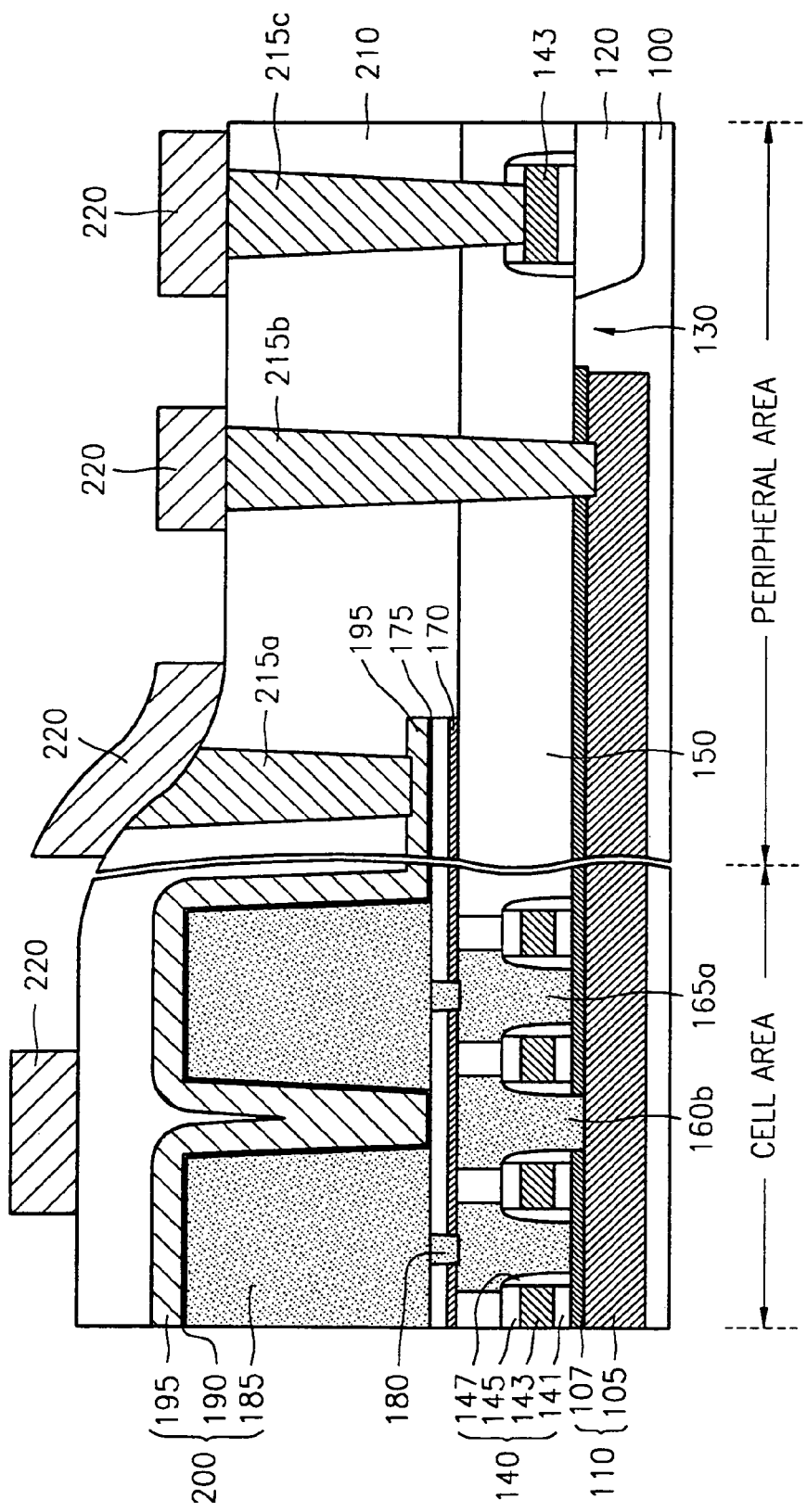
FIG. 13 is a cross-sectional view showing a semiconductor memory device according to an embodiment of the present invention.

FIG. 13 is a cross-sectional view of a semiconductor memory device formed using the methods described above, including the storage node contact hole 155 and the bit line contact hole 160.

As shown in FIG. 13, the semiconductor substrate 100 includes bit line structures 110, an isolation layer 120, and an active region 130. As described above, each of the bit line structures 110 includes the bit line conductive layer 105, the protective insulating layer 107, and the spacer 109 (FIG. 9). The isolation layer 120 can be formed in the spaces between the bit line structures 110. The active region 130 is surrounded by the bit line structures 110 and the isolation layer 120 and can be an epitaxial layer and electrically insulated from the bit line structures 110.

Next, word line structures 140 are arranged in the same or similar manner shown in the plan views already described. Each of the word line structures 140 includes the gate insulating layer 141, the word line 143, the hard mask layer 145, and the word line spacer 147. Next, the source region 145a and the drain region 145b are formed in the active region 130 on either side of the word line structures 140 (FIG. 13), and the interlayer insulating layer 150 is formed on top of the semiconductor substrate 100, on which the word line structures 140 are formed. Here, the interlayer insulating layer 150 can be planarized by, for example, CMP to expose the surface of the word line structures 140. Inside the interlayer insulating layer 150, the storage node contact hole 155 for exposing the source region 145a and the bit line contact hole 160 for exposing the drain region 145b and the bit lines 105 are formed (FIG. 12).

Preferably, as described above, a predetermined portion of the protective insulating layer 107 is removed, before the interlayer insulating layer 150 is formed. After the interlayer insulating layer 150 is formed, a predetermined portion of the interlayer insulating layer 150 is etched to form a bit line contact hole 160.

The first contact pad 165a and the second contact pad 165b are formed to have substantially the same height as the first interlayer insulating layer 150 to fill the storage node contact hole 155 and the bit line contact hole 160. Here, the first contact pad 165a contacts the source region 145a, and the second contact pad 165b contacts the drain region 145b and the exposed bit line conductive layer 105. Next, a second interlayer insulating layer 175 is formed on the interlayer insulating layer 150, including the first and the second contact pads 165a and 165b. The second interlayer insulating layer 175 includes a storage contact pad 180 contacting the first contact pad 165a. An etch stopper 170 is formed under the upper interlayer insulating layer 175. Alternatively, the etch stopper 170 can be formed on the upper interlayer insulating layer 175.

A storage node electrode 185 is formed on the upper interlayer insulating layer 175. The storage node electrode 185 is formed to contact the storage contact pad 180, for example, in a stacked, concave, or cylindrical form. A capacitor 200 is formed by sequentially forming a dielectric layer 190, and a plate electrode 195 on the storage electrode 185. Next, a third interlayer insulating layer 210 is formed on the resultant structure including the capacitor 200. Subsequently, the third interlayer insulating layer 210 can be planarized. The third interlayer insulating layer 210 includes a contact plug 215a contacting the plate electrode 195, a contact plug 215b contacting the bit line conductive layer 105, and a contact plug 215c contacting a selected word line 143. On the third interlayer insulating layer 210, a patterned metal interconnection layer 220 is formed to contact the contact plugs 215a, 215b, and 215c, individually.

According to an embodiment of the present invention, the bit line structures 110 are arranged under the word line structures 140, in other words, on the same plane as the isolation layer 120.

In addition, the storage node contact pad 180 and the storage node electrode 185 are formed on the word line structures 140, and the storage node contact pad 180 does not exist between the bit line structures 110. Thus, it is possible to ensure insulation and prevent short circuits between the bit line structures 110 and the storage node contact pad 180.

Furthermore, since the bit line structures 110 are formed under the word line structures 140, it is possible to supplement the height of the storage node electrode 185 with the thickness of the bit line structures 110. Thus, the storage node electrode 185 is actually extended to the lower portion. Therefore, even though there is no change in the height of the storage node electrode 185, the storage capacitance is increased.

As described above in detail, according to an aspect of the present invention, the bit line structures are formed under the word line structures, in other words, are buried in the substrate. Accordingly, it is possible to supplement the height of the storage node electrode with the thickness of the bit line structures. Also, it is easy to ensure insulation between the bit line structures and the storage node contact pads.

The present invention was described in detail with reference to preferred embodiments but is not limited to the above embodiments, and it will be understood by those skilled in the art that various changes in form and details may be made without departing from the spirit and scope of the invention.

What is claimed is:

1. A method for manufacturing a semiconductor memory device, the method comprising:
    forming a plurality of bit line structures arranged in parallel on a semiconductor substrate;
    forming an isolation layer in a predetermined portion between the bit line structures to define a predetermined active region;
    forming a semiconductor layer in the predetermined active region surrounded by the bit line structures and the isolation layer;
    forming a plurality of word line structures arranged in parallel on the bit line structures, the isolation layer, and the semiconductor layer; and
    forming source and drain regions in the semiconductor layer on either side of the word line structures.

2. The method of claim 1, wherein the forming the bit line structures comprises:
    forming a conductive layer for the bit lines on the semiconductor substrate;
    forming a protective insulating layer on the conductive layer;
    patterning the protective insulating layer and the conductive layer to define the bit lines; and
    forming a spacer on sidewalls of the bit lines and the protective insulating layer.

3. The method of claim 1, wherein the forming the isolation layer comprises:
    forming an oxide layer filling spaces between the bit line structures;
    planarizing the oxide layer until the surface of the bit line structures is exposed;
    etching a portion of the oxide layer and exposing a region of the semiconductor substrate corresponding to the predetermined active region.

4. The method of claim 1, wherein the forming the semiconductor layer comprises epitaxially growing a semiconductor material on the predetermined active region in the semiconductor substrate approximately to the height of the isolation layer and the bit line structures.

5. The method of claim 1, wherein the forming the word line structures comprises:
    forming a gate insulating layer on the bit line structures, the isolation layer, and the semiconductor layer;
    forming a conductive layer for the word lines on the gate insulating layer;
    forming a hard mask layer on the conductive layer;
    patterning the hard mask layer, the conductive layer for the word lines, and the gate insulating layer; and
    forming a word line spacer on sidewalls of the patterned hard mask layer, the patterned conductive layer and the patterned gate insulation layer.

6. The method of claim 2, further comprising:
    forming a first interlayer insulating layer overlying the word line structures;
    forming a second contact pad within the first interlayer insulating layer and contacting the source region and a second contact pad within the first interlayer insulating layer and contacting the drain region and the bit line;
    forming a second interlayer insulating layer on the first interlayer insulating layer;
    forming a storage node contact pad within the second interlayer insulating layer to be connected to the first contact pad; and
    forming a storage node capacitor on the second interlayer insulating layer to be connected to the storage node contact pad.

7. The method of claim 6, wherein the forming the first and the second contact pads comprises;
    etching a portion of the first interlayer insulating layer to form a first contact hole exposing the source region and a second contact hole exposing a drain region and the bit lines;
    forming a conductive layer filling the first and second contact holes; and
    planarizing the conductive layer.

8. The method of claim 7, further comprising etching a portion of a protective insulating layer of the bit line structures to expose a portion thereof, before etching a portion of the first interlayer insulating layer.

9. The method of claim 6, wherein the first interlayer insulating layer is formed of a material having a different etch selectivity from the protective insulating layer.

10. A method for manufacturing a semiconductor memory device, the method comprising:
    forming a plurality of bit line structures comprising a plurality of bit lines and arranged in parallel on a silicon substrate;
    forming an isolation layer between the bit line structures to define a predetermined active region;
    epitaxially growing a silicon layer on the predetermined active region, which is surrounded by the bit line structures and the isolation layer, to the height of the bit line structures and the isolation layer;
    forming a plurality of word line structures comprising a plurality of word lines and arranged in parallel on the bit line structures, the isolation layer, and the silicon layer;
    forming source and drain regions in the silicon layer on either side of the word line structures;
    forming a first interlayer insulating layer on the silicon layer on which the word line structures are formed;

forming a first contact pad contacting the source region and a second contact pad contacting the drain region and the bit lines, within the first interlayer insulating layer;

forming a second interlayer insulating layer on the first interlayer insulating layer;

forming a storage node contact pad connected to the first contact pad; and forming a storage node capacitor on the second interlayer insulating layer and contacting the storage node contact pad.

11. The method of claim 10, wherein the forming the plurality of bit line structures comprises:

forming a conductive layer for the bit lines on the silicon substrate;

forming a protective insulating layer on the conductive layer;

patterning the protective insulating layer and the conductive layer to define the bit lines; and forming a spacer on side walls of the bit lines and the patterned protective insulating layer.

12. The method of claim 10, wherein the forming the isolation layer comprises:

forming an oxide layer filling spaces between the bit line structures;

planarizing the oxide layer to expose the surface of the bit line structures;

etching a portion of the oxide layer and exposing a region of the silicon substrate corresponding to the predetermined active region.

13. The method of claim 10, wherein the forming the plurality of word line structures comprises:

forming a gate insulating layer on the bit line structures, the isolation layer, and the silicon layer;

forming a conductive layer for the word lines on the gate insulating layer;

forming a hard mask layer on the conductive layer;

patterning the hard mask layer, the conductive layer, and the gate insulating layer to define the word lines; and forming a word line spacer on sidewalls of the patterned hard mask layer and the word lines.

14. The method of claim 10, wherein the forming the first and the second contact pads comprises:

etching a portion of the first interlayer insulating layer to form a first contact hole exposing the source region and a second contact hole exposing the drain region and the bit lines;

forming a conductive layer filling the first and second contact holes; and planarizing the conductive layer.

15. The method of claim 14, further comprising etching a portion of a protective insulating layer of the bit line structures to be exposed, before etching a portion of the first interlayer insulating layer.

16. The method of claim 10, wherein the first interlayer insulating layer is formed of a material having a different etch selectivity from the protective insulating layer.

* * * * *